US010790116B2

(12) United States Patent
Likhanskii et al.

(10) Patent No.: US 10,790,116 B2
(45) Date of Patent: Sep. 29, 2020

(54) ELECTOSTATIC FILTER AND METHOD FOR CONTROLLING ION BEAM USING ELECTOSTATIC FILTER

(71) Applicant: APPLIED Materials, Inc., Santa Clara, CA (US)

(72) Inventors: Alexandre Likhanskii, Malden, MA (US); Frank Sinclair, Boston, MA (US); Shengwu Chang, South Hamilton, MA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/197,238

(22) Filed: Nov. 20, 2018

(65) Prior Publication Data

US 2020/0161089 A1   May 21, 2020

(51) Int. Cl.
*H01J 37/317* (2006.01)
*H01J 37/12* (2006.01)
*H01J 37/08* (2006.01)

(52) U.S. Cl.
CPC .......... *H01J 37/3171* (2013.01); *H01J 37/08* (2013.01); *H01J 37/12* (2013.01); *H01J 2237/053* (2013.01); *H01J 2237/057* (2013.01)

(58) Field of Classification Search
CPC ........ H01J 37/3171; H01J 37/08; H01J 37/12; H01J 2237/053; H01J 2237/057
USPC ......... 250/396 R, 397, 492.1, 492.2, 492.21, 250/492.22, 492.23, 492.3
See application file for complete search history.

(56) References Cited

U.S. PATENT DOCUMENTS

| | | |
|---|---|---|
| 6,326,631 B1 | 12/2001 | Politiek et al. |
| 6,573,517 B1 | 6/2003 | Sugitani et al. |
| 7,022,984 B1 | 4/2006 | Rathmell et al. |
| 7,326,941 B2 | 2/2008 | Chen et al. |
| 7,888,653 B2 | 2/2011 | Kellerman et al. |
| 8,129,695 B2 | 3/2012 | Kellerman et al. |
| 8,389,964 B2 | 3/2013 | Igo et al. |
| 9,293,295 B2 | 3/2016 | Yagita |
| 2004/0013820 A1 | 1/2004 | Cadieu |
| 2009/0189096 A1 | 7/2009 | Chen et al. |
| 2010/0065761 A1 | 3/2010 | Graf et al. |
| 2011/0163229 A1 | 7/2011 | Frosien et al. |

(Continued)

FOREIGN PATENT DOCUMENTS

| | | |
|---|---|---|
| JP | 2010123547 A | 6/2010 |
| JP | 2015191740 A | 11/2015 |

(Continued)

OTHER PUBLICATIONS

International Search Report and Written Opinion dated Apr. 28, 2020, for the International Patent Application No. PCT/US2019/059075, filed on Oct. 31, 2019, 8 pages.

(Continued)

*Primary Examiner* — Nicole M Ippolito

(57) ABSTRACT

An apparatus may include a main chamber, the main chamber comprising a plurality of electrodes; an entrance tunnel, the entrance tunnel having an entrance axis extending into the main chamber along a first direction; and an exit tunnel, connected to the main chamber and defining an exit axis, wherein the entrance axis and the exit axis define a beam bend of at least 30 degrees therebetween.

20 Claims, 5 Drawing Sheets

(56) References Cited

U.S. PATENT DOCUMENTS

| | | | |
|---|---|---|---|
| 2012/0104273 A1* | 5/2012 | Ryding | H01J 37/08 |
| | | | 250/424 |
| 2012/0168637 A1 | 7/2012 | Radovanov et al. | |
| 2013/0119263 A1 | 5/2013 | Smick et al. | |
| 2015/0279612 A1 | 10/2015 | Yagita | |
| 2015/0380206 A1 | 12/2015 | White et al. | |
| 2016/0089912 A1 | 3/2016 | Chiba et al. | |
| 2016/0111245 A1 | 4/2016 | Saadatmand et al. | |
| 2016/0189912 A1 | 6/2016 | Eisner et al. | |
| 2018/0218894 A1 | 8/2018 | Likhanskii | |
| 2019/0259560 A1 | 8/2019 | Chang et al. | |

FOREIGN PATENT DOCUMENTS

| | | |
|---|---|---|
| KR | 1020120116451 A | 10/2012 |
| WO | 2007013869 A1 | 2/2007 |
| WO | 2013106220 A1 | 7/2013 |

OTHER PUBLICATIONS

International Search Report and Written Opinion dated Apr. 9, 2020, for the International Patent Application No. PCT/US2019/059067, filed on Oct. 31, 2019, 9 pages.

International Search Report and Written Opinion dated Apr. 9, 2020, for the International Patent Application No. PCT/US2019/059069, filed on Oct. 31, 2019, 10 pages.

International Search Report and Written Opinion dated Apr. 9, 2020, for the International Patent Application No. PCT/US2019/059079, filed on Oct. 31, 2019, 7 pages.

\* cited by examiner

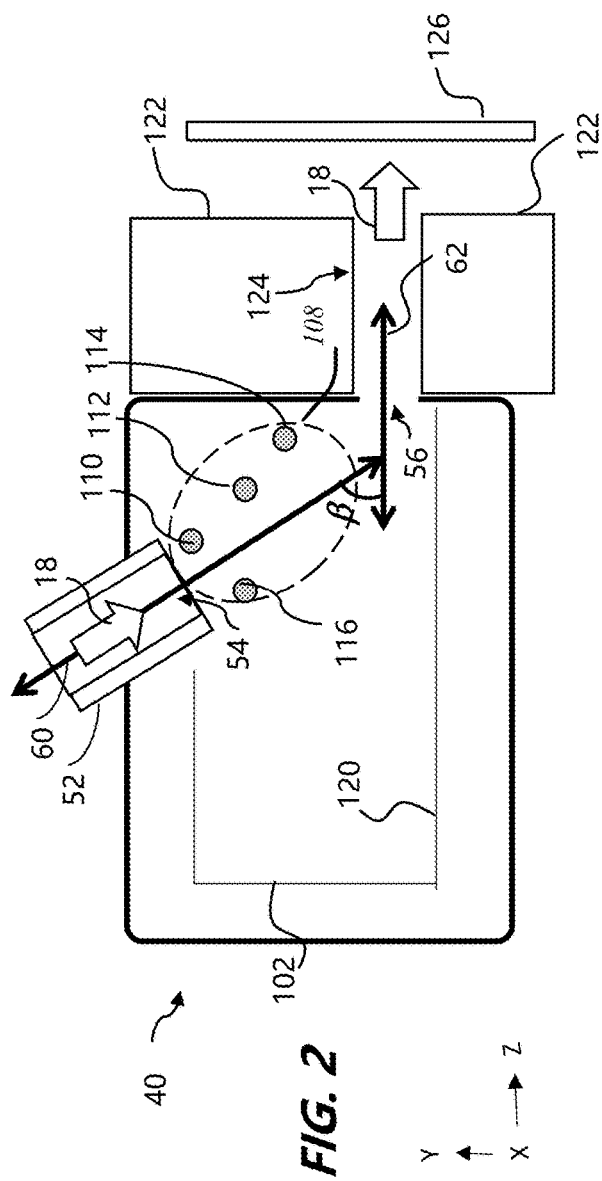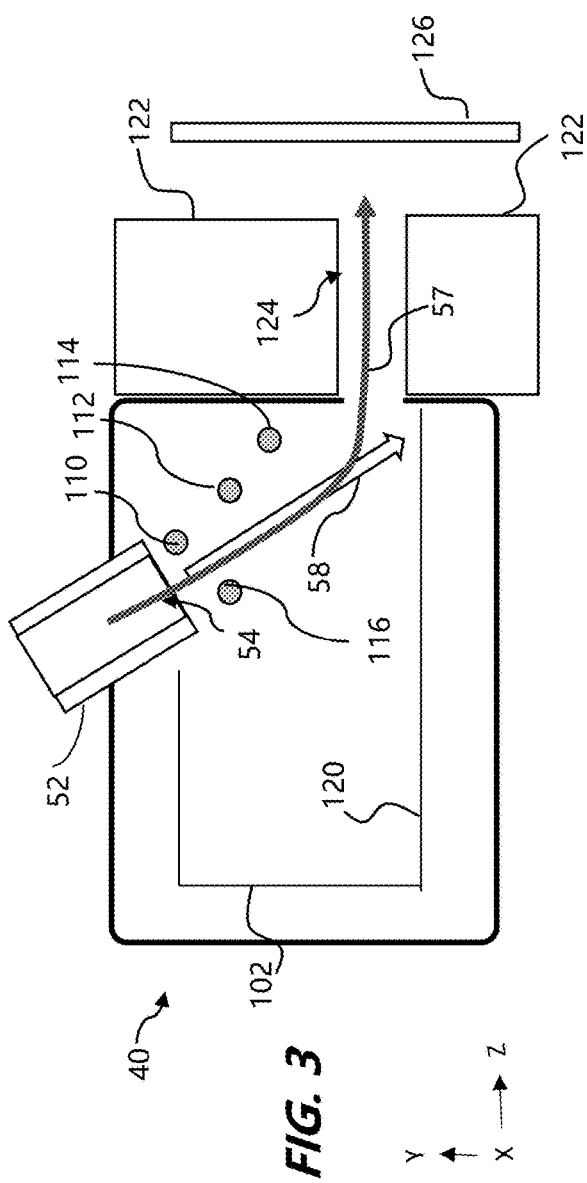

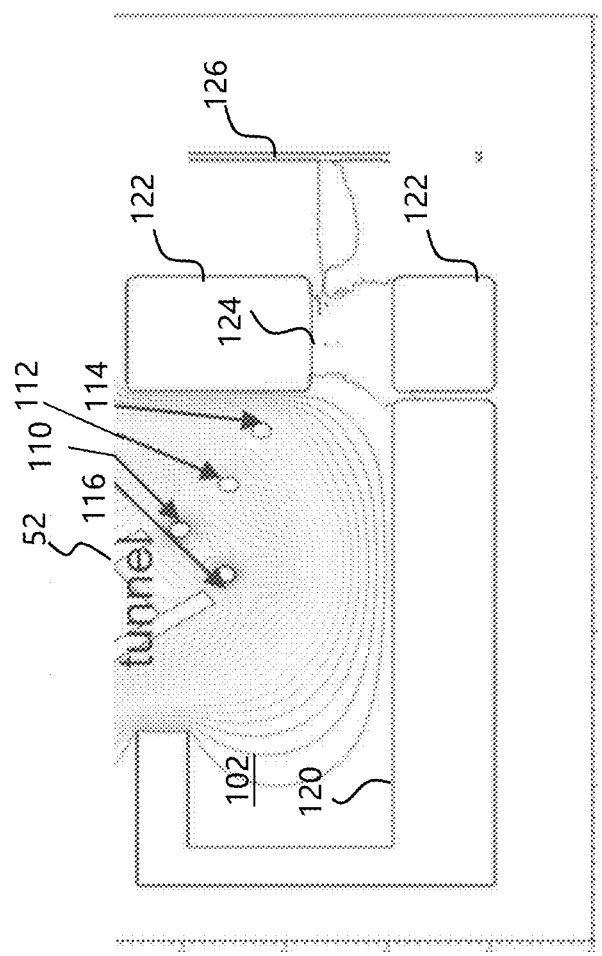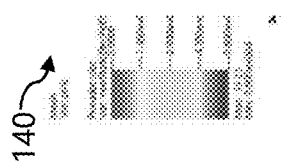
FIG. 5B

ELECTROSTATIC FILTER AND METHOD FOR CONTROLLING ION BEAM USING ELECTROSTATIC FILTER

FIELD OF THE DISCLOSURE

The disclosure relates generally to apparatus and techniques for implanting substrates, and more particularly, to improved energy filters for ion beams.

BACKGROUND OF THE DISCLOSURE

Ion implantation is a process of introducing dopants or impurities into a substrate via bombardment. In semiconductor manufacturing, the dopants are introduced to alter electrical, optical, or mechanical properties.

Ion implantation systems may comprise an ion source and a series of beam-line components. The ion source may comprise a chamber where ions are generated. The ion source may also comprise a power source and an extraction electrode assembly disposed near the chamber. The beam-line components, may include, for example, a mass analyzer, a first acceleration or deceleration stage, a collimator, and a second acceleration or deceleration stage. Much like a series of optical lenses for manipulating a light beam, the beam-line components can filter, focus, and manipulate ions or ion beam having particular species, shape, energy, and/or other qualities. The ion beam passes through the beam-line components and may be directed toward a substrate mounted on a platen or clamp. The substrate may be moved in one or more dimensions (e.g., translate, rotate, and tilt) by an apparatus, sometimes referred to as a roplat.

In many ion implanters a downstream electrostatic module, may function as an electrostatic lens to control ion beam energy, ion beam shape, and ion beam size. The electrostatic module may accelerate or decelerate an ion beam to a final energy, while altering the direction of the ion beam. By altering the direction of the ion beam, energetic neutrals may be screened out, resulting in a final beam having a well-defined energy.

Known electrostatic modules may employ, for example, multiple pairs of electrodes, such as seven upper and lower electrodes arranged in pairs, where the electrodes bound and guide an ion beam traveling therethrough. The electrodes may be arranged as rods spaced equidistant from an ion beam. The rod/electrode potentials are set to create electric fields in the electrostatic module causing the ion beam to decelerate, deflect and focus the ion beam.

One of the main concerns during operation of an electrostatic module is the maintenance of low particle counts on substrates being processed by the ion beam.

Because the electrostatic module is located closely to the substrate, material inadvertently ejected from the substrate may inadvertently return to surfaces within the electrostatic module, such as on electrodes. Conversely, foreign material accumulating on electrodes of the electrostatic module may etch away or flake off from the electrostatic module and land upon the substrate. To minimize accumulation of particles on the substrate, frequent and expensive preventative maintenance operations may be scheduled to clean or replace electrodes.

With respect to these and other considerations, the present disclosure is provided.

BRIEF SUMMARY

In one embodiment, an apparatus may include a main chamber, comprising a plurality of electrodes. The apparatus may include an entrance tunnel, the entrance tunnel having an entrance axis extending into the main chamber. The apparatus may include an exit tunnel, connected to the main chamber and defining an exit axis, wherein the entrance axis and the exit axis define a beam bend, the beam bend being at least 30 degrees therebetween.

In a further embodiment, an ion implanter may include an ion source to generate an ion beam, and an electrostatic filter module, disposed to receive the ion beam. The electrostatic filter module may include a main chamber, comprising a plurality of electrodes, as well as an entrance tunnel, having an entrance axis extending into the main chamber along a first direction. The electrostatic filter module may include an exit tunnel, connected to the main chamber and defining an exit axis, wherein the entrance axis and the exit axis define a beam bend, the beam bend being least 30 degrees therebetween.

In an additional embodiment, an electrostatic filter module may include a main chamber, comprising a plurality of electrodes, arranged in an asymmetric configuration. The electrostatic filter module may include an entrance tunnel, having an entrance axis extending into the main chamber along a first direction, a plasma flood gun, the plasma flood gun defining an exit tunnel, connected to the main chamber and defining an exit axis, wherein the entrance axis and the exit axis define a beam bend of at least 30 degrees therebetween.

BRIEF DESCRIPTION OF THE DRAWINGS

FIG. 2 shows the structure of an electrostatic filter, according to exemplary embodiments of the disclosure;

FIG. 3 shows the trajectories of ions and neutrals in the electrostatic filter of FIG. 2, according to exemplary embodiments of the disclosure;

FIG. 5B illustrates the electrostatic potentials applied to generate the ion beam in the electrostatic filter of FIG. 5A;

Figure 1:
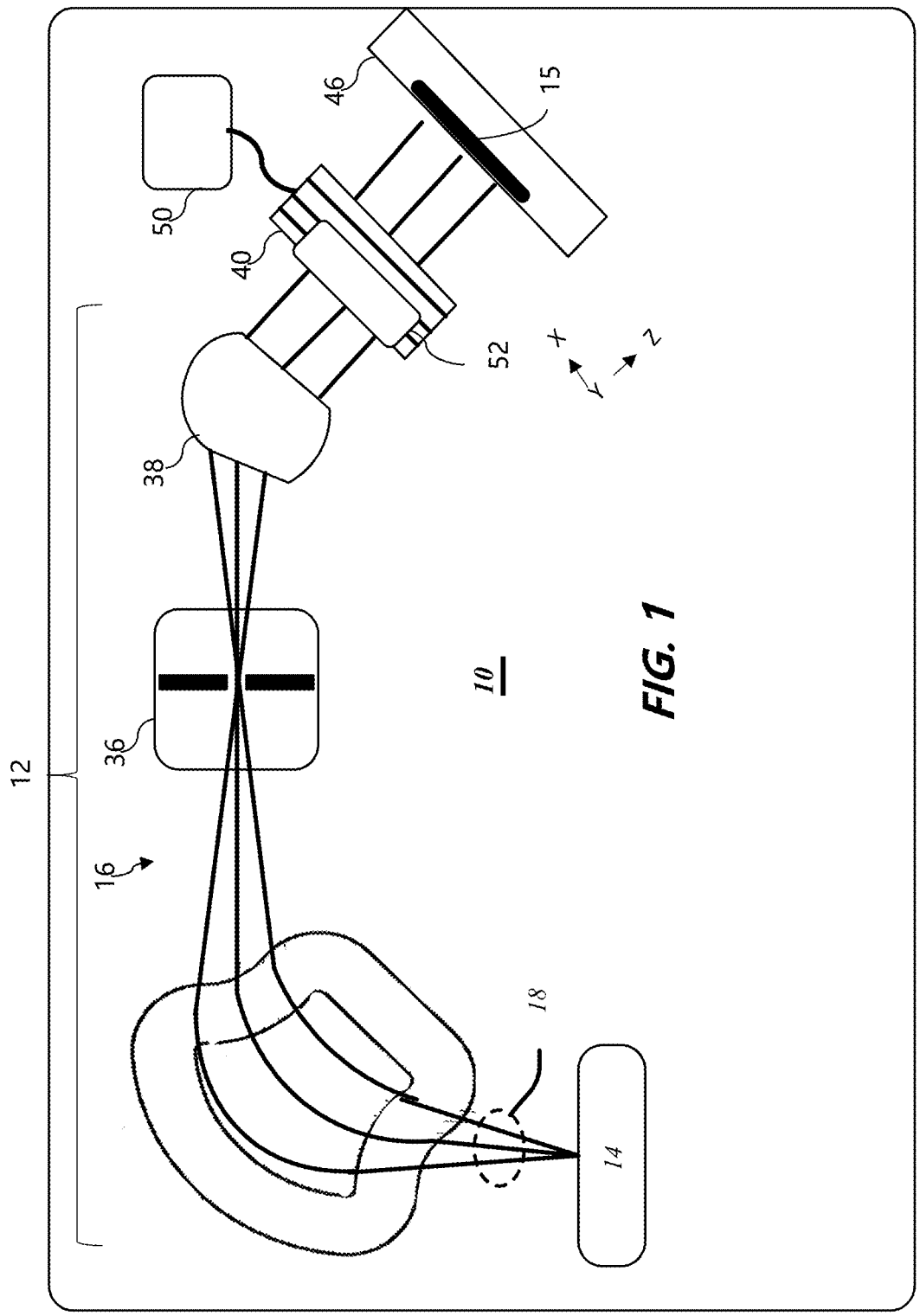
FIG. 1 shows an exemplary embodiment demonstrating an ion implantation system, according to embodiments of the disclosure.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

DETAILED DESCRIPTION

A system and method in accordance with the present disclosure will now be described more fully hereinafter with reference to the accompanying drawings, where embodiments of the system and method are shown. The system and method may be embodied in many different forms and are not be construed as being limited to the embodiments set forth herein. Instead, these embodiments are provided so this disclosure will be thorough and complete, and will fully convey the scope of the system and method to those skilled in the art.

For the sake of convenience and clarity, terms such as "top," "bottom," "upper," "lower," "vertical," "horizontal," "lateral," and "longitudinal" will be used herein to describe the relative placement and orientation of these components and their constituent parts, with respect to the geometry and orientation of a component of a semiconductor manufacturing device as appearing in the figures. The terminology will include the words specifically mentioned, derivatives thereof, and words of similar import.

As used herein, an element or operation recited in the singular and proceeded with the word "a" or "an" are understood as potentially including plural elements or operations as well. Furthermore, references to "one embodiment" of the present disclosure are not intended to be interpreted as precluding the existence of additional embodiments also incorporating the recited features.

Provided herein are approaches for improved operation and reliability of an electrostatic module acting as an electrostatic filter, for example. In exemplary embodiments, an electrostatic filter is disclosed having a novel architecture, including novel arrangement of an electrode assembly in a main chamber of the electrostatic module.

Referring now to FIG. 1, an exemplary embodiment demonstrating a system 10 is shown, where the system 10 may be used for ion implantation in accordance with the present disclosure. The system 10 includes, among other components, an ion source 14 for producing an ion beam 18, such as a ribbon beam or a spot beam, and a series of beam-line components. The ion source 14 may comprise a chamber for receiving a flow of gas 24 t to generate ions. The ion source 14 may also comprise a power source and an extraction electrode assembly disposed near the chamber. The beamline extending from the ion source 14 to an electrostatic filter 40 may be deemed an upstream beamline 12. In some non-limiting embodiments, the beam-line components 16 of the upstream beamline may include, for example, a mass analyzer 34, a first acceleration or deceleration stage 36, and a collimator 38, disposed upstream of the electrostatic filter 40, which filter may provide deceleration and/or acceleration or the ion beam 18.

In exemplary embodiments, the beam-line components 16 may filter, focus, and manipulate ions or the ion beam 18 to have a species, shape, energy, and/or other qualities. The ion beam 18 passing through the beam-line components 16 may be directed toward a substrate 15 mounted on a platen or clamp within a process chamber 46. The substrate may be moved in one or more dimensions (e.g., translate, rotate, and tilt).

The electrostatic filter 40 is a beam-line component configured to independently control deflection, deceleration, and focus of the ion beam 18. In some embodiments, the electrostatic filter 40 is a vertical electrostatic energy filter (VEEF) or electrostatic filter EF. As will be described in greater detail below, the electrostatic filter 40 may be arranged as an electrode assembly defining at least one electrode configuration. The electrode configuration may include a plurality of electrodes arranged in series along the beamline to process the ion beam 18 through the electrostatic filter 40. In some embodiments, the electrostatic filter may include a set of upper electrodes disposed above the ion beam 18 and a set of lower electrodes disposed below the ion beam 18. A difference in potentials between the set of upper electrodes and the set of lower electrodes may also be varied along the central ion beam trajectory to deflect the ion beam at various points along the central ray trajectory (CRT). The system 10 may further include an electrode voltage supply, shown as electrode voltage assembly 50, as well as an entrance tunnel 52, coupled to the electrostatic filter 40, where the configuration of the entrance tunnel with respect to the electrostatic filter 40 is described below. As disclosed in the embodiments to follow, the entrance tunnel 52 may form a part of the electrostatic filter 40, where the entrance tunnel and electrodes within the electrostatic filter 40 are arranged in a novel configuration to improve operation of the system 10.

Referring now to FIG. 2, the structure of one variant of the electrostatic filter 40 is shown. In FIG. 2, there is shown a side cross-sectional view the electrostatic filter 40, electrode voltage assembly 50, and entrance tunnel 52. As shown, the electrostatic filter 40 includes a main chamber 102, extending above and partially encasing electrostatic filter 40, leaving an entrance aperture 54 and exit aperture 56 to conduct the ion beam 18 therethrough. The electrostatic filter 40 includes electrode assembly 108, including electrode 110, electrode 112, electrode 114, and electrode 116. As shown in FIG. 2, the plurality of electrodes is arranged in an asymmetric configuration, where the plurality of electrodes define a beam path 57, shown in FIG. 3. A first electrode, electrode 116, is disposed on a first side of the beam path 57, and at least three electrodes are disposed on a second side of the beam path 57, meaning the electrode 110, electrode 112, and electrode 114. Also shown in FIG. 3 is a neutral trajectory 58, indicating possible path for energetic neutrals captured by the electrostatic filter 40. In other embodiments, just two electrodes may be disposed on the second side of beam path 57.

As further shown in FIG. 2, the entrance tunnel 52 may be characterized by an entrance axis 60, extending into the main chamber 102 along a first direction. Also shown in FIG. 2 is an exit tunnel 124, where the exit tunnel 124 defines an exit axis 62, where the entrance axis 60 and the exit axis 62 define a beam bend of at least 30 degrees therebetween. The beam bend is shown in FIG. 2 as the angle β. While in some embodiments, the beam bend may be as small as 30 degrees, in other embodiments, the beam bend may be between 40 degrees and 90 degrees.

As shown in FIG. 3, the plurality of electrodes of the electrode assembly 108 may define the beam path 57, representing, for example, an average direction of propagation of the ion beam 18, or a position of the central ray trajectory of the ion beam 18. In operation, a determined set of voltages may be applied to the different electrodes of the electrode assembly 108, to decelerate, deflect, and focus the ion beam 18 in a manner causing the ion beam 18 to follow the beam path 57. As such, a first electrode, meaning the electrode 116, is disposed on a first side of the beam path 57, meaning to the left and below the beam path 57. The other electrodes, such as at least three electrodes, are disposed on a second side of the beam path 57, meaning above and to the right of the beam path 57. As represented by FIG. 3, in some embodiments, just one electrode may be disposed on the first side of the beam path 57, in an asymmetric configuration, where at least three electrodes are disposed on the second side.

As further shown in FIG. 3, the beam path 57 may lie generally parallel to the entrance axis 60 at the entrance aperture 54, and may lie generally parallel to the exit axis 62 at the exit aperture 56, the ion beam 18 (for clarity, just portions of the ion beam 18 are shown in FIG. 2). Thus, the ion beam 18 may be deflected through an angle corresponding to the beam bend, defined by the electrostatic filter 40 of FIG. 2. Since this beam bend may be 30 degrees or more, energetic neutrals entering the electrostatic filter 40 at the same or similar energies as the ion beam 18, may readily be captured by walls of the electrostatic filter 40. The energetic neutrals will not be deflected by the voltages applied to the electrode assembly 108 causing the ion beam 18 to follow the beam path 57, and accordingly will not be diverted through the exit tunnel 124.

In operation, the electrode assembly 108 may be coupled to receive different voltages from the electrode voltage assembly 50. As an example, the electrode 110 and electrode 116 may function as suppression electrodes, where a highest negative potential of the electrodes of the main chamber 102 is applied to the electrode 110 and electrode 116 to suppress electrons. The exact voltages applied to these suppression electrodes may also act to focus an ion beam and to begin deflection of the ion beam 18. The additional electrodes, such as electrode 112 and electrode 114, may continue deflection of the ion beam to the exit tunnel 124 and may decelerate the ion beam. In addition, the main chamber 102 includes chamber walls 120 to shape electrostatic fields in the electrostatic filter 40, and to collect sputtered material from the substrate 126, as detailed below.

Notably, the exit tunnel 124 may be grounded to neutralize an exiting ion beam before implanting into the substrate 126, as well as providing shielding to the electrode assembly 108 from sputter deposition. Moreover, the exit tunnel 124 may shield particle trajectories from powered electrodes of the electrode assembly 108 from reaching the substrate 126, as further explained with respect to the figures to follow.

As also shown in FIG. 2 and FIG. 3, the electrostatic filter 40 may include a plasma flood gun 122, or may abut a plasma flood gun 122 as part of an electrostatic filter module, where the plasma flood gun 122 is used to supply electrons to the ion beam 18. The plasma flood gun 122 may be arranged to operate according to the principles of known plasma flood guns. The plasma flood gun 122 may include the exit tunnel 124 as shown, where the ion beam 18 exits the plasma flood gun 122 to emerge from the exit tunnel 124 and to propagate to the substrate 126.

According to embodiments of the disclosure, the electrodes in the main chamber 102, together with the plasma flood gun 122, including the exit tunnel 124, may be arranged so the electrodes are not visible from outside the plasma flood gun 122. This feature is further illustrated by FIG. 4, where a line of sight trajectory 128 is shown. The line of sight trajectory 128 may be considered to be the trajectory having the steepest angle through the exit tunnel 124, and thus moving closest to the electrode assembly 108. As such, other line of sight trajectories from outside the plasma flood gun 122 may project into the main chamber 102 in a more horizontal trajectory, at further distances from the electrode assembly 108. Thus, no line of sight trajectories from outside the plasma flood gun 122 may strike the electrode assembly 108.

Figure 4:
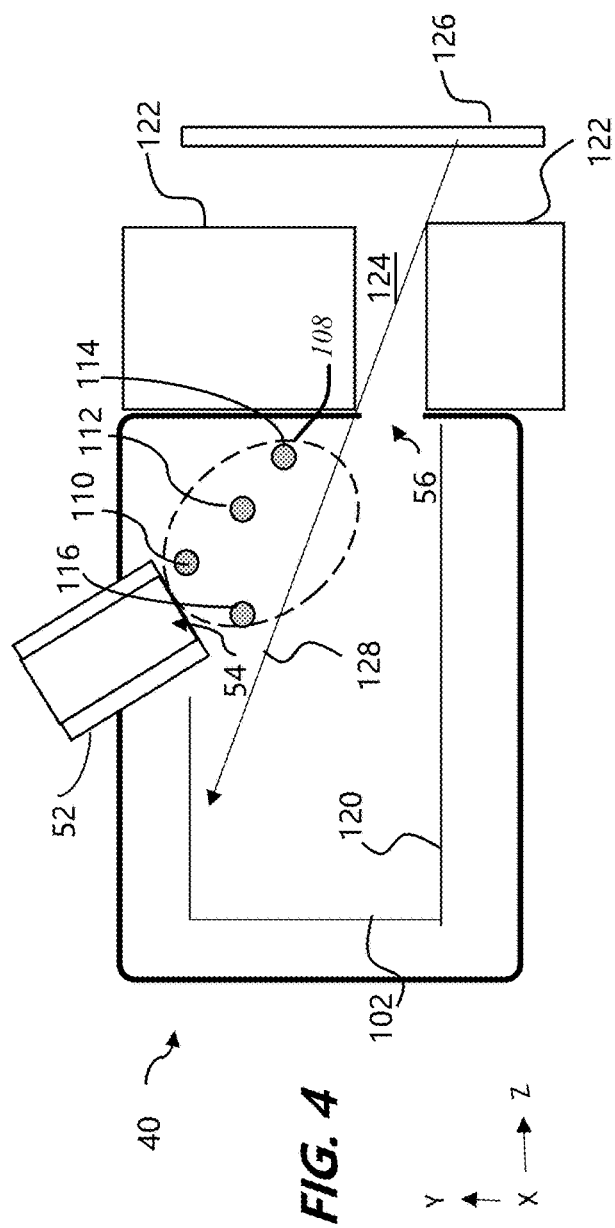
FIG. 4 illustrates one example of the geometry of electrode assembly and exit tunnel of the electrostatic filter of FIG. 2.

This geometry highlights a salient feature of the embodiment of FIGS. 2-4, in that sputtered particles emitted from the substrate 126 along linear trajectories may be screened from striking and depositing on electrodes of the electrode assembly 108.

As further shown in FIG. 2, the entrance tunnel 52 is disposed to enter the main chamber 102 along a first side of the main chamber 102, wherein the exit tunnel 124 is disposed along a second side of the main chamber 102, adjacent to the first side of the main chamber 102. This configuration may be advantageous to protect the electrodes of electrode assembly 108 from matter ejected from the substrate 126, since the electrodes may all be arranged on one side of the exit tunnel 124. However, in other embodiments, the exit tunnel 124 may be disposed along a second side of the main chamber 102, opposite to the first side of the main chamber where the entrance tunnel 52 enters the main chamber 102.

Figure 5A:
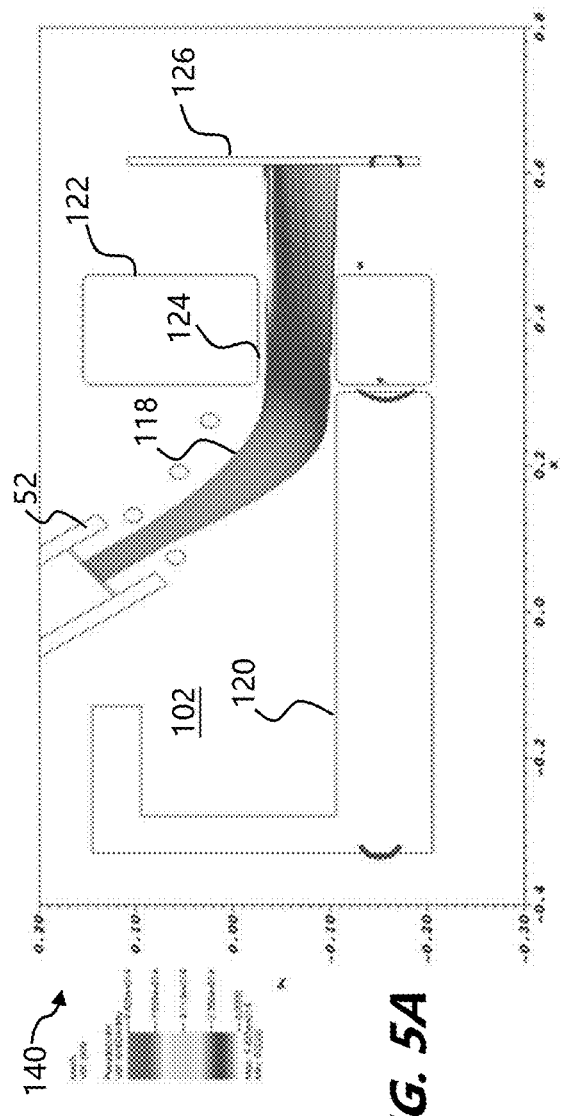
FIG. 5A illustrates the shape of a 3 keV phosphorous beam as transported through an electrostatic filter in accordance with embodiments of the disclosure.

Turning now to FIG. 5A, there is shown a simulation of the shape, position, and trajectory of a 3 keV phosphorous (P+) ion beam in cross-section, as transported through an electrostatic filter 140, in accordance with embodiments of the disclosure. The electrostatic filter 140 may represent a variant of the electrostatic filter 40, discussed above. FIG. 5B illustrates the electrostatic potentials applied to generate the ion beam in the electrostatic filter of FIG. 5A. In this simulation shown, an ion beam 118 is deflected from the entrance tunnel 52 to travel into the exit tunnel 124. The following potentials (voltages) are applied to the electrodes of electrode assembly: ~50 kV on the electrode 110 and electrode 16, ~30 kV on electrode 112 and ~10 kV on electrode 114. Notably, in this embodiment and other embodiments, various surfaces, including chamber walls 120 (disposed in the interior of the main chamber 102), are coupled at ground potential. For example, the walls of the exit tunnel 124 may be grounded. Thus, the potentials of the electrode assembly 108 and the chamber walls 120 and exit aperture 56 may guide the ion beam 118 as shown. In this configuration, the phosphorous beam is transported through a beam bend of approximately 50 degrees before striking the substrate 126. In the simulation shown, approximately 65 mA current is delivered to the substrate 126.

Figure 6:
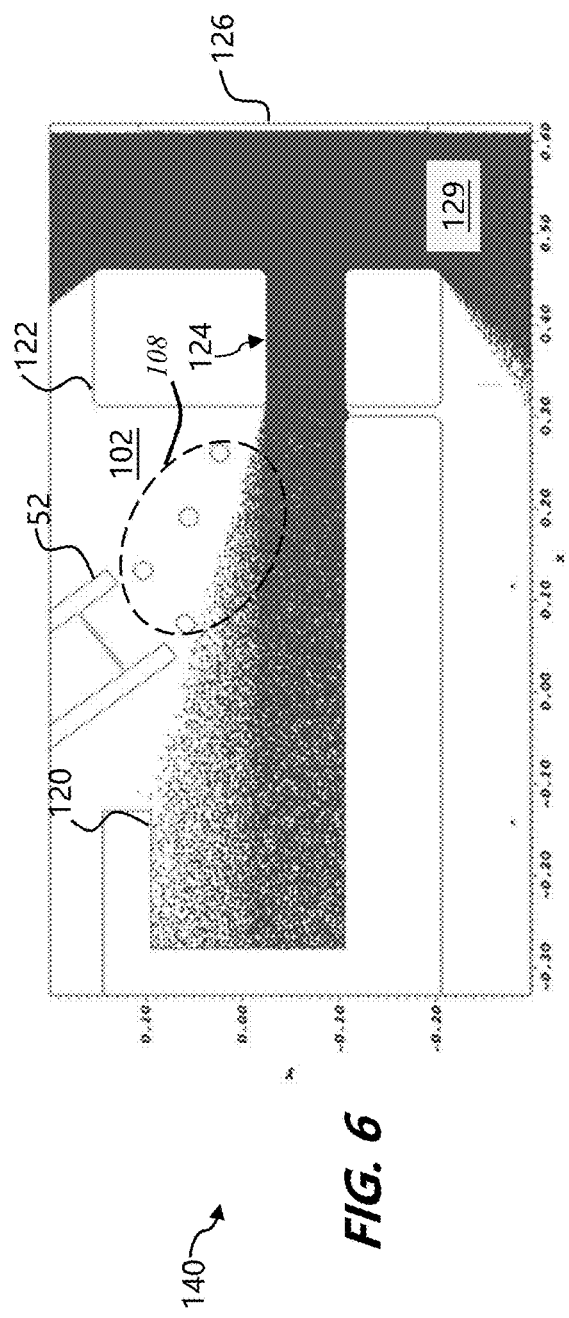
FIG. 6 illustrates the trajectories of particles resputtered from a substrate within an electrostatic filter, according to embodiments of the present disclosure.

FIG. 6 illustrates the trajectories of particles resputtered from a substrate 126, within the electrostatic filter 140, according to embodiments of the present disclosure. The simulation of FIG. 6 shows the distribution of sputtered material ejected from the substrate 126. The sputtered material represents material initially disposed at the substrate 126, where an incident ion beam used to implant ions into the substrate 126, may resputter a certain amount of material located on or near the surface of the substrate 126. The simulation of FIG. 6 illustrates resputtered material may be ubiquitous in the downstream region 129, located between the plasma flood gun 122 and the substrate 124. In addition, the exit tunnel 124, defined by the plasma flood gun 122, is replete with resputtered particles, indicating the particles travel back from the substrate 126 toward the main chamber 102 of the electrostatic filter 40.

As further shown in FIG. 6, the simulation of resputterred particles forms a dense plume within the main chamber 102, with a somewhat denser portion in line with the exit tunnel 124. A less dense portion of the plume expands upwardly into the main chamber 102. The plume of sputtered particles may then land at various locations of the (grounded) chamber walls 120 of the main chamber 102. In this simulation, in few or no cases do resputtered particles land on electrodes of the electrode assembly 108. Thus, the configuration of FIG. 6 is unlikely to accumulate any resputtered material on electrodes of the electrode assembly 108, at least by direct resputtering from the substrate 126.

Figure 7:
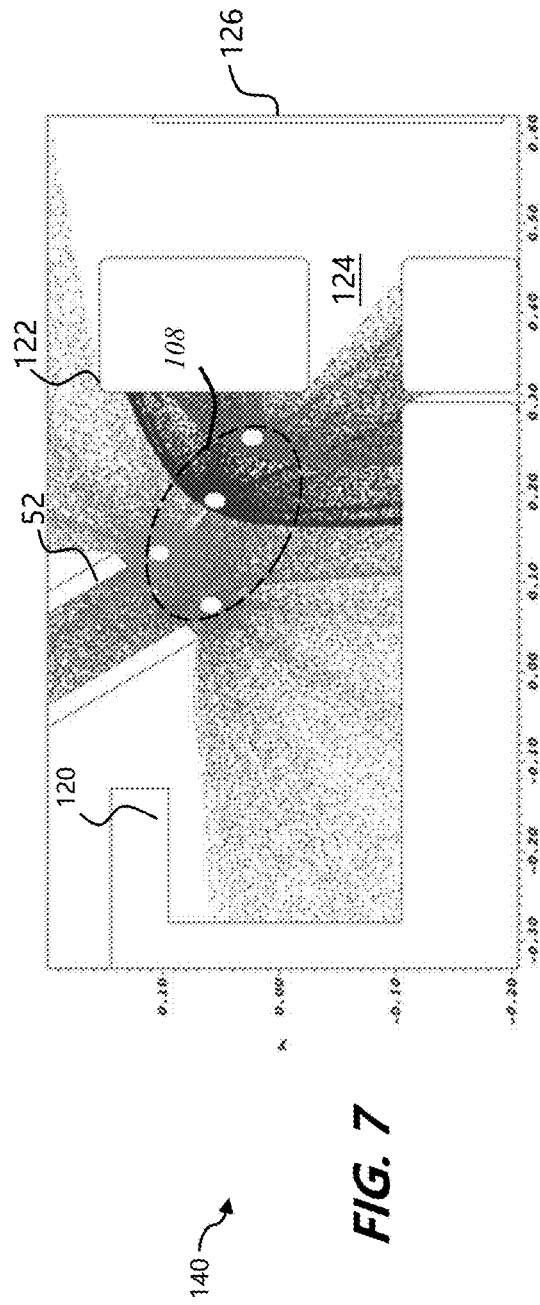
FIG. 7 illustrates the trajectories of negative particles emitted from electrodes of an electrostatic filter in accordance with embodiments of the disclosure.

Turning now to FIG. 7, there is shown a further simulation of the variant of the electrostatic filter 140 of FIG. 6. Specifically, FIG. 7 depicts trajectories of negatively charged particles leaving from the electrodes of the electrode assembly 108. The trajectories of negatively charged particles tend to lead away from a given electrode, forming a complex pattern, dependent upon the individual voltages applied to the different electrodes. Notably, none of negatively charged particle trajectories lead to the substrate 126, due to the shielding provided by the geometry of the exit tunnel 124 with respect to the positions of the electrodes of electrode assembly 108.

In accordance with various embodiments, the electrodes of electrode assembly 108 may be elongated along the X-axis of the Cartesian coordinate system shown. As such, the electrodes may be useful for controlling a ribbon beam having a cross-section, also elongated along the X-axis, where the ribbon beam may be tens of centimeters wide along the X-axis and may have a height on the order of several centimeters. The embodiments are not limited in this context.

The specific configuration of electrodes of FIGS. 2-7, where one electrode is arranged on one side of the beam path and three electrodes are arranged on an opposite side of the beam path may be especially appropriate for processing ion beams of low to moderate final ion beam energy. For example, these configurations may be suitable for operation below 50 keV, where relatively lower voltages and electrostatic stresses may be present on electrodes, allowing fewer electrodes, such as just three electrodes, to be used for decelerating and steering an ion beam. This fewer number of electrodes allows a more compact main chamber design, still effective in "hiding" electrodes from resputtered substrate material, and conversely, from generating unwanted negatively charged particles capable of striking the substrate.

Moreover, while the above embodiments illustrate configurations having three electrodes on one side of a beam path, in other configurations, four electrodes, five electrodes, or more may be arranged on one side of the beam path. Additionally, while the above embodiments show just one electrode on the opposite side of the beam path, in other embodiments, more than one electrode may be arranged on the opposite side of the beam path.

In addition, configurations are possible where the electrodes are arranged to define a steeper beam bend, such as 60 degrees, 70 degrees, 80 degrees, or 90 degrees, or a lower beam bend, such as 30 degrees. In these other configurations the arrangement of the shape of the main chamber, the position of electrodes and the location of the exit tunnel may be such to prevent or substantially reduce resputtered particles from the substrate from striking the electrodes, and to prevent or reduce negatively charged particles from exiting electrodes and striking the substrate.

In view of the foregoing, at least the following advantages are achieved by the embodiments disclosed herein. The present embodiments provide a first advantage in that direct contamination of a substrate from an electrostatic filter is reduced by eliminating the ability for negatively charged particles generated the filter electrodes from striking the substrate. In addition, another advantage provided by the present embodiments is the elimination of indirect substrate contamination resulting from accumulation of resputtered material from the substrate on electrodes of the electrostatic filter, resulting in an additional contamination source do to subsequent sputtering or flaking from the electrodes.

The present disclosure is not to be limited in scope by the specific embodiments described herein. Indeed, other various embodiments and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, the present disclosure has been described herein in the context of a particular implementation in a particular environment for a particular purpose, yet those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

The invention claimed is:

1. An apparatus, comprising:
a main chamber, the main chamber comprising a plurality of electrodes;
an entrance tunnel, configured direct an ion beam into the main chamber, the entrance tunnel extending into the main chamber and defining an entrance axis; and
an exit tunnel, connected to the main chamber and defining an exit axis, wherein the entrance axis and the exit axis define a beam bend, the beam bend being at least 30 degrees therebetween, and wherein the plurality of electrodes are arranged within the main chamber to define a non-zero angle with respect to the exit axis.

2. The apparatus of claim 1, wherein the plurality of electrodes is arranged in an asymmetric configuration.

3. The apparatus of claim 2, wherein the plurality of electrodes defines a beam path, wherein a first electrode is disposed on a first side of the beam path and wherein at least three electrodes are disposed on a second side of the beam path.

4. The apparatus of claim 3, wherein just one electrode is disposed on the first side of the beam path.

5. The apparatus of claim 1, wherein the entrance tunnel is disposed along a first side of the main chamber, and wherein the exit tunnel is disposed along a second side of the main chamber, adjacent to the first side of the main chamber.

6. The apparatus of claim 1, further comprising a plasma flood gun, the plasma flood gun including the exit tunnel, wherein the plurality of electrodes is not visible from outside the plasma flood gun.

7. The apparatus of claim 1, wherein the entrance tunnel is disposed to enter the main chamber along a first side of the main chamber, and wherein the exit tunnel is disposed along a second side of the main chamber, opposite to the first side of the main chamber.

8. The apparatus of claim 1, wherein the beam bend is between 40 degrees and 90 degrees.

9. The apparatus of claim 1, wherein the plurality of electrodes is arranged in an asymmetric configuration.

10. An ion implanter, comprising:
an ion source to generate an ion beam; and
an electrostatic filter module, disposed to receive the ion beam, and comprising:
a main chamber, the main chamber comprising a plurality of electrodes;
an entrance tunnel, configured direct an ion beam into the main chamber, the entrance tunnel extending into the main chamber and defining an entrance axis aligned along a first direction; and
an exit tunnel, connected to the main chamber and defining an exit axis, wherein the entrance axis and the exit axis define a beam bend, the beam bend being least 30 degrees therebetween,
and wherein the plurality of electrodes are arranged within the main chamber to define a non-zero angle with respect to the exit axis.

11. The ion implanter of claim 10, wherein the plurality of electrodes defines a beam path, wherein a first electrode is disposed on a first side of the beam path and wherein at least three electrodes are disposed on a second side of the beam path.

12. The ion implanter of claim 11, wherein just one electrode is disposed on the first side of the beam path.

13. The ion implanter of claim 10, wherein the entrance tunnel is disposed along a first side of the main chamber, and wherein the exit tunnel is disposed along a second side of the main chamber, adjacent to the first side of the main chamber.

14. The ion implanter of claim 10, further comprising a plasma flood gun, the plasma flood gun including the exit tunnel, wherein the plurality of electrodes is not visible from outside the plasma flood gun.

15. The ion implanter of claim 10, wherein the beam bend is between 40 degrees and 90 degrees.

16. The ion implanter of claim 10, wherein the plurality of electrodes is arranged in an asymmetric configuration.

17. An electrostatic filter module, comprising:
a main chamber, the main chamber comprising a plurality of electrodes, arranged in an asymmetric configuration;
an entrance tunnel, configured direct an ion beam into the main chamber the entrance tunnel extending into the main chamber and defining an entrance axis aligned along a first direction; and
a plasma flood gun, the plasma flood gun defining an exit tunnel, connected to the main chamber and defining an exit axis, wherein the entrance axis and the exit axis define a beam bend of at least 30 degrees therebetween, and wherein the plurality of electrodes are arranged within the main chamber to define a non-zero angle with respect to the exit axis.

18. The electrostatic filter module of claim 17, wherein the plurality of electrodes defines a beam path, wherein just one electrode is disposed on a first side of the beam path and wherein at least three electrodes are disposed on a second side of the beam path.

19. The electrostatic filter module of claim 17, wherein the plurality of electrodes is not visible from outside the plasma flood gun.

20. The electrostatic filter of claim 17 wherein the entrance tunnel is disposed along a first side of the main chamber, and wherein the exit tunnel is disposed along a second side of the main chamber, adjacent to the first side of the main chamber.

* * * * *